US009940978B2

(12) United States Patent
Boujamaa

(10) Patent No.: US 9,940,978 B2
(45) Date of Patent: Apr. 10, 2018

(54) PROGRAMMABLE MEMORY DEVICE SENSE AMPLIFIER

(71) Applicant: INTEL IP CORPORATION, Santa Clara, CA (US)

(72) Inventor: El Mehdi Boujamaa, Valbonne (FR)

(73) Assignee: INTEL IP CORPORATION, Santa Clara, CA (US)

( * ) Notice: Subject to any disclaimer, the term of this patent is extended or adjusted under 35 U.S.C. 154(b) by 0 days.

(21) Appl. No.: 15/332,775

(22) Filed: Oct. 24, 2016

(65) Prior Publication Data

US 2017/0103789 A1 Apr. 13, 2017

Related U.S. Application Data

(63) Continuation of application No. 14/721,854, filed on May 26, 2015, now Pat. No. 9,478,308.

(51) Int. Cl.

| | |
|---|---|
| ***G11C 7/06*** | (2006.01) |
| ***G11C 17/16*** | (2006.01) |
| ***G11C 17/18*** | (2006.01) |
| ***G11C 13/00*** | (2006.01) |

(52) U.S. Cl.

CPC ............ *G11C 7/062* (2013.01); *G11C 13/004* (2013.01); *G11C 17/16* (2013.01); *G11C 17/18* (2013.01); *G11C 2013/0054* (2013.01)

(58) Field of Classification Search

CPC ......... G11C 7/062; G11C 17/16; G11C 17/18; G11C 13/004

USPC ................. 365/189.07, 196, 205, 207, 210.1

See application file for complete search history.

(56) References Cited

U.S. PATENT DOCUMENTS

| | | | |
|---|---|---|---|
| 6,597,598 B1 * | 7/2003 | Tran ....................... | G11C 7/062 365/100 |
| 6,693,826 B1 | 2/2004 | Black, Jr. et al. | |
| 6,717,877 B2 * | 4/2004 | Suzuki ..................... | G11C 7/22 365/185.2 |
| 6,747,891 B2 | 6/2004 | Hoffmann et al. | |
| 6,760,265 B2 * | 7/2004 | La Rosa ................ | G11C 7/062 365/185.21 |
| 6,807,088 B2 * | 10/2004 | Tsuchida ................. | G11C 11/15 365/158 |

(Continued)

OTHER PUBLICATIONS

Jeon, et al., "A Low-Offset High-Speed Double-Tail Dual-Rail Dynamic Latched Comparator," Department of Electrical and Computer Engineering, Northeastern University, 2010, 4 pages.

(Continued)

*Primary Examiner* — Viet Q Nguyen

(74) *Attorney, Agent, or Firm* — Schwabe, Williamson & Wyatt, P.C.

(57) ABSTRACT

Embodiments include circuits, apparatuses, and systems for programmable memory device sense amplifiers. In embodiments, an electronic circuit may include a programmable memory device having a first resistance in a first state and a second resistance in a second state, a reference element, an amplifier to generate a first output signal based at least in part on the resistance of the programmable memory device and a second output signal based at least in part on a current from the reference element, and a comparator to determine a state of the programmable memory device based on the first and second output signals from the amplifier. Other embodiments may be described and claimed.

21 Claims, 5 Drawing Sheets

(56) References Cited

U.S. PATENT DOCUMENTS 6,856,546 B2 * 2/2005 Guterman .......... G11C 11/5621 257/E27.103
7,027,341 B2 * 4/2006 Morikawa .......... G11C 7/062 365/189.09
7,031,212 B2 * 4/2006 La Rosa .......... G11C 7/067 365/185.21
7,154,774 B2 * 12/2006 Bedeschi .......... G11C 7/062 365/148
7,272,034 B1 9/2007 Chen et al.
7,280,390 B2 10/2007 Kostylev et al.
7,369,450 B2 * 5/2008 Choy .......... G11C 7/065 365/185.21
7,403,432 B2 7/2008 Lehmann et al.
7,426,134 B2 9/2008 Happ et al.
7,630,239 B2 12/2009 Senda et al.
7,692,979 B2 * 4/2010 Fuji .......... G11C 13/0004 365/189.09
7,742,352 B1 6/2010 Hara et al.
7,782,695 B2 * 8/2010 Bedarida .......... G11C 7/02 365/185.2
7,826,255 B2 * 11/2010 Xi .......... G11C 11/16 365/148
7,864,609 B2 1/2011 Porter et al.
7,916,516 B2 3/2011 Wei et al.
8,009,467 B2 8/2011 Nebashi et al.
8,284,610 B2 * 10/2012 Liao .......... G11C 16/28 365/185.21
8,478,308 B2 * 7/2013 Wang .......... G01S 5/0072 348/14.02
8,488,363 B2 7/2013 Rao et al.
8,817,529 B2 8/2014 Aoki
8,947,924 B2 2/2015 Li et al.
8,988,946 B1 * 3/2015 D'Abreu .......... G11C 16/28 365/185.08
9,195,592 B1 11/2015 Weingarten et al.
9,281,032 B2 * 3/2016 Jefremow .......... G11C 7/22
9,305,611 B2 * 4/2016 Chang .......... G11C 16/30
9,478,308 B1 * 10/2016 Boujamaa .......... G11C 17/165
2002/0008544 A1 * 1/2002 Lim .......... G11C 17/18 326/86
2004/0105301 A1 * 6/2004 Toyoda .......... G11C 13/0004 365/154
2005/0024967 A1 * 2/2005 Matsuoka .......... G11C 16/28 365/207
2006/0227592 A1 * 10/2006 Parkinson .......... G11C 11/5678 365/148
2008/0175075 A1 * 7/2008 La Rosa .......... G11C 7/062 365/189.15
2008/0273394 A1 * 11/2008 Kern .......... G11C 16/28 365/185.21
2009/0219746 A1 * 9/2009 Bosmuller .......... G11C 17/14 365/72
2010/0265783 A1 * 10/2010 Kern .......... G11C 7/062 365/210.1
2012/0069633 A1 * 3/2012 Katoh .......... G11C 13/004 365/148
2014/0254241 A1 * 9/2014 Shiimoto .......... G11C 13/004 365/148
2014/0321192 A1 10/2014 Bedeschi
2015/0036415 A1 2/2015 Di Pendina et al.

OTHER PUBLICATIONS

Non-Final Office Action dated Jan. 22, 2016 for U.S. Appl. No. 14/721,854, 14 pages.

Notice of Allowance dated Jun. 24, 2016 for U.S. Appl. No. 14/721,854, 8 pages.

* cited by examiner

PROGRAMMABLE MEMORY DEVICE SENSE AMPLIFIER

CROSS REFERENCE TO RELATED APPLICATION

This application is a continuation of U.S. patent application Ser. No. 14/721,854, entitled "PROGRAMMABLE MEMORY DEVICE SENSE AMPLIFIER," filed on May 26, 2015, and claims priority to the application Ser. No. 14/721,854. The Specification of the application Ser. No. 14/721,854 is incorporated herein by reference.

FIELD

Embodiments of the present invention relate generally to the technical field of electronic circuits, and more particularly to programmable memory device sense amplifiers.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Programmable memory devices such as eFuses and antifuses often use sense amplifiers to discretize between a blown or unblown eFuse or antifuse resistive state. Conventional sense amplifiers typically have a trip-point that is more sensitive to power supply voltage than may be desirable and/or are subject to kick back noise (e.g., voltage coupling or gate/source following behavior). For a wide statistical distribution of a blown eFuse, tail bits can exhibit relatively small resistive values, leading to a high yield impact if the read circuitry is not accurate enough. The equivalent input resistive threshold (trip-point) stability through process voltage, and temperature variations (PVT corner) is often used for sense amplifier assessment. Conventional static or dynamic sense amplifiers typically exhibit a wider trip-point spread with respect to different PVT corners than may be desirable, particularly for low voltage applications.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The description and figures may refer to transistors as MPx transistor to indicate that the transistor is a p-type transistor or MNx transistor to indicate that the transistor is an n-type transistor. The type of transistor is presented as an example, and other embodiments may use other types of transistors to carry out similar functionality.

Figure 1:
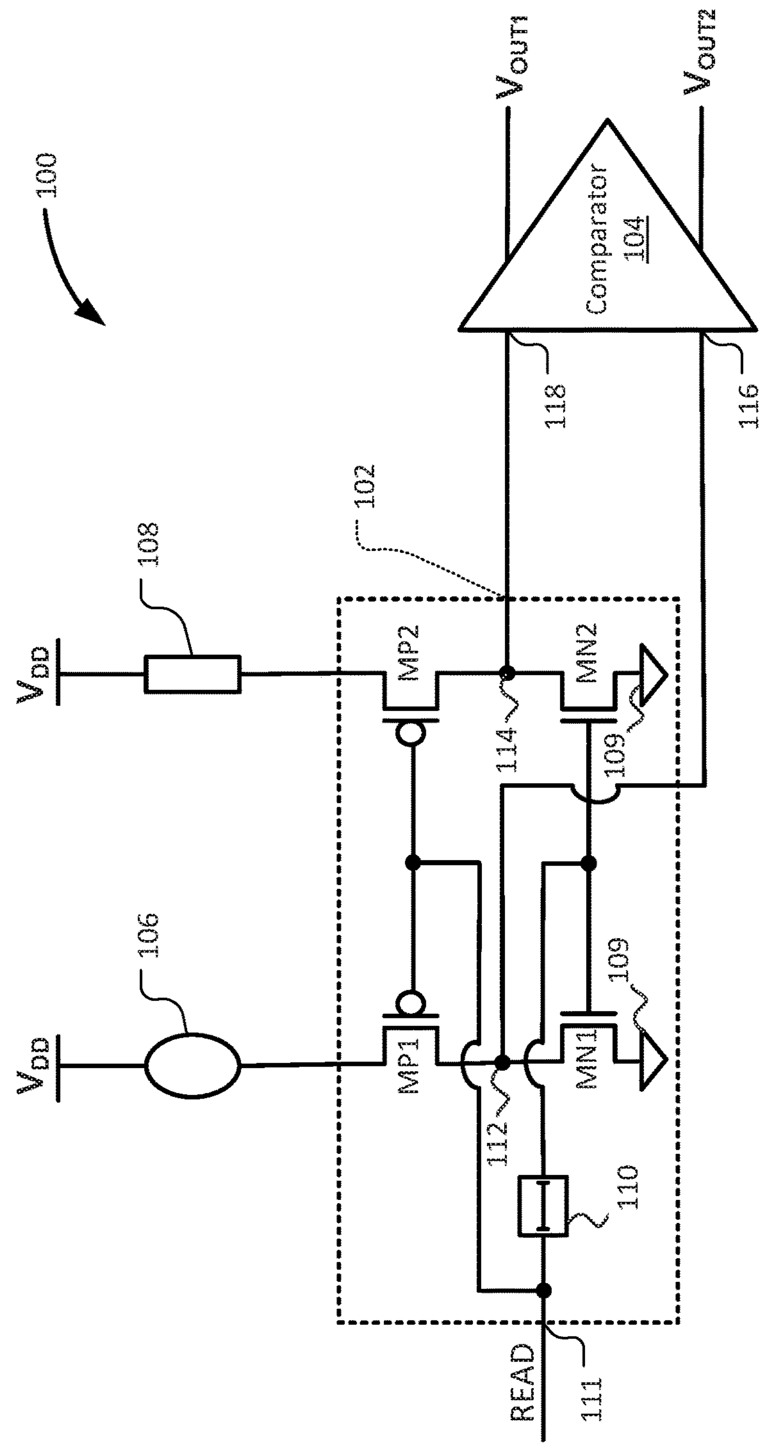
FIG. 1 illustrates a two stage dynamic sense amplifier circuit, in accordance with various embodiments.

FIG. 1 schematically illustrates a two stage dynamic sense amplifier circuit 100 (hereinafter "circuit 100") in accordance with various embodiments. In embodiments, the circuit 100 may be a circuit for an electronic device that may include an amplifier 102 and a comparator 104. In embodiments, portions of the circuit 100 before the comparator 104 (e.g., with respect to the direction of signal flow) may be a first stage, and the comparator 104 may be a second stage.

The amplifier 102 may be configured as a complementary metal oxide semiconductor (CMOS) device having p-type metal oxide semiconductor (PMOS) transistors MP1 and MP2, and n-type metal oxide semiconductor (NMOS) transistors MN1 and MN2. In some embodiments, the amplifier 102 may be configured using bipolar transistors rather than PMOS and NMOS transistors, with pnp type bipolar transistors replacing PMOS transistors or npn type bipolar transistors replacing NMOS transistors. The circuit 100 may further include a programmable memory device 106 and a reference element 108. In various embodiments, the reference element 108 maybe a resistive element or a current source circuit. As shown, a first terminal of the programmable memory device 106 may receive a reference voltage $V_{DD}$ and a first terminal of the reference element 108 may receive the reference voltage $V_{DD}$ in various embodiments. In some embodiments, a second terminal of the programmable memory device 106 may be electrically coupled with a source of transistor MP1 and a second terminal of the reference element 108 may be electrically coupled with a source of transistor MP2. In various embodiments, a drain of transistor MP1 may be electrically coupled with a drain of transistor MN1 and a drain of transistor MP2 may be electrically coupled with a drain of transistor MN2. A source of transistor MN1 and a source of transistor MN2 may be electrically coupled with ground 109 that may be 0 volts in various embodiments.

In various embodiments, the programmable memory device 106 may be a device having a first resistance in a first state (first resistive state) and a second resistance in a second state (second resistive state), such as an eFuse, an antifuse, or a resistive memory core-cell (e.g., a phase change memory (PCM) device, a resistive random access memory (ReRAM) device, a magnetoresistive random access memory (MRAM) device, an oxide random access memory (OXRAM) device, a memristor device, or a resistive memory device based on another technology). In embodiments, the first state may be an unblown state and the second state may be a blown state. Generally, an eFuse has a relatively low resistance in an unblown state and a relatively high resistance in a blown state, while an antifuse has a relatively high resistance in an unblown state and a relatively low resistance in a blown state. Accordingly, one of the first and second states may be a relatively low resistive state and the other of the first and second states may be a relatively high resistive state in various embodiments. In embodiments, an eFuse, an antifuse, or another programmable resistive memory element may have a range of expected resistance values in the unblown state and the blown state. In embodiments, the reference element 108 may be a resistive element that may have a resistance value that is between the ranges of expected resistance values in the unblown state and the blown state. For example, in some embodiments where the programmable memory device 106 is an eFuse, the reference element 108 may be a resistive element having a resistance value less than or equal to the lowest expected resistance value of the eFuse in a blown state and greater than or equal to the highest expected resistance value of the eFuse in an unblown state. In some embodiments where the programmable memory device 106 is an antifuse, the reference element 108 may be a resistive element having a resistance value less than or equal to the lowest expected resistance value of the antifuse in an unblown state and greater than or equal to the highest expected resistance value of the antifuse in a blown state. In various embodiments, the reference element 108 may be a resistor, a trimmable resistor, an unblown eFuse, an unblown antifuse, another resistive element, or a current source circuit.

In various embodiments, the amplifier 102 may have a read signal input terminal 111 to receive a READ signal and a delay element 110 to generate a delayed version of the READ signal. In embodiments, the READ signal may be provided to the gates of transistors MP1 and MP2 as shown, and the delayed version of the READ signal may be provided to the gates of transistors MN1 and MN2, as shown. In various embodiments, the amplifier 102 may generate a first output signal at a first node 112 where the drain of transistor MP1 and the drain of transistor MN1 are electrically coupled, and the amplifier 102 may generate a second output signal at a second node 114 where the drain of transistor MP2 and the drain of transistor MN2 are electrically coupled. The comparator 104 may receive the first output signal from the amplifier 102 at a first input terminal 116 and the comparator 104 may receive the second output signal from the amplifier 102 at a second input terminal 118 in various embodiments. The comparator 104 may generate a first voltage output, $V_{OUT1}$ and a second voltage output, $V_{OUT2}$, based at least in part on the first and second output signals from the amplifier 102 in various embodiments. In embodiments, the amplifier 102 may generate the first output signal based at least in part on a resistance of the programmable memory device 106. In embodiments, the amplifier 102 may generate the second output signal based at least in part on a current from the reference element 108. In embodiments, the reference element 108 may be a resistive element and the amplifier 102 may generate the second output signal based at least in part on a resistance of the reference element 108.

During an idle mode, when the READ signal=$V_{DD}$, the first node 112 and the second node 114 may be tied to ground 109 and second stage output voltages, $V_{OUT1}$ and $V_{OUT2}$, may be pre-charged to $V_{DD}$ in various embodiments. After the READ signal switches from $V_{DD}$ to 0V, NMOS transistors MN1 and MN2 of the first stage may be switched off and currents flowing through MP1 and MP2 may charge the first node 112 and the second node 114, respectively, at different rates. In embodiments, those charging rates may be based at least in part on a resistive state of the programmable memory device 106. In embodiments, those charging rates may also be based at least in part on a current from the reference element 108. In embodiments, the reference element 108 may be a resistive element and the current from the reference element 108 may be based at least in part on a resistive value of the reference element 108. If the programmable memory device 106 has a resistive value higher than a resistive value of the reference element 108, the first node 112 may have a smaller slope than the second node 114, and if the reference element 108 has a resistive value higher than a resistive value of the programmable memory element 106, the second node 114 may have a smaller slope than the first node 112, in various embodiments. In embodiments, the second stage may transform the slope difference from the first node 112 and the second node 114 into a digital voltage level by first grounding $V_{OUT1}$ if the first node 112 has a higher slope than the second node 114, or by first grounding $V_{OUT2}$ if the second node 114 has a higher slope than the first node 112. In some embodiments, the comparator 104 may generate a different number of outputs, such as a single output.

Figure 2:
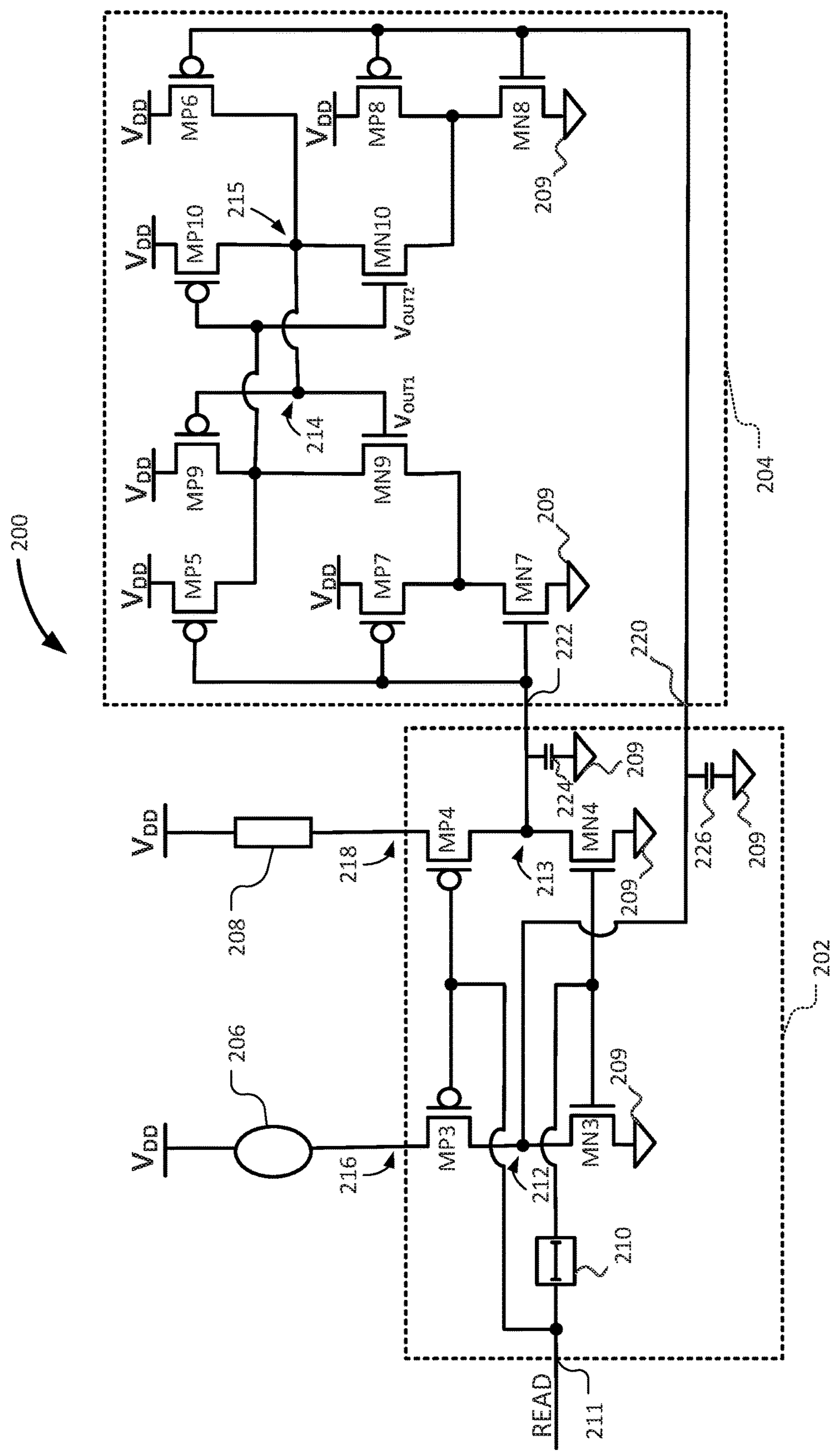
FIG. 2 illustrates a two stage dynamic sense amplifier circuit that includes a triggered latch comparator circuit, in accordance with various embodiments.

FIG. 2 illustrates a two stage dynamic sense amplifier circuit 200 (hereinafter "circuit 200") that may include an amplifier 202 and a triggered latch comparator circuit 204 (hereinafter "comparator 204"), in accordance with various embodiments. The amplifier 202 may be configured similarly to the amplifier 102 described with respect to FIG. 1, in various embodiments. In embodiments, portions of the circuit 200 before the comparator 204 may be a first stage, and the comparator 204 may be a second stage.

The amplifier 202 may be configured as a CMOS device having PMOS transistors MP3 and MP4, and NMOS transistors MN3 and MN4. As shown, a first terminal of a programmable memory device 206 may receive a reference voltage $V_{DD}$ and a first terminal of a resistive element 208 may receive the reference voltage $V_{DD}$ in various embodiments. In some embodiments, a second terminal of the programmable memory device 206 may be electrically coupled with a source of transistor MP3 and a second terminal of the resistive element 208 may be electrically coupled with a source of transistor MP4. In various embodiments, a drain of transistor MP3 may be electrically coupled with a drain of transistor MN3 and a drain of transistor MP4 may be electrically coupled with a drain of transistor MN4. A source of transistor MN3 and a source of transistor MN4 may be electrically coupled with ground 209 that may be 0 volts, in various embodiments.

In various embodiments, the programmable memory device 206 may be a device having a first resistance in a first state (first resistive state) and a second resistance in a second state (second resistive state), such as an eFuse, an antifuse, or a resistive memory core-cell (e.g., a phase change memory (PCM) device, an oxide random access memory (OXRAM) device, or a resistive memory device based on another technology). In embodiments, the first state may be an unblown state and the second state may be a blown state. The reference element 208 may be a resistive element that may have a resistance value that is between the first resistance and the second resistance. In some embodiments where the programmable memory device 206 is an eFuse, the reference element 208 maybe a resistive element that may have a resistance value less than or equal to the lowest expected resistance value of the eFuse in a blown state and greater than or equal to the highest expected resistance value of the eFuse in an unblown state. In some embodiments where the programmable memory device 206 is an antifuse, the reference element 208 may be a resistive element that may have a resistance value less than or equal to the lowest expected resistance value of the antifuse in an unblown state and greater than or equal to the highest expected resistance value of the antifuse in a blown state. In various embodiments, the reference element 208 may be a resistor, a trimmable resistor, an unblown eFuse, an unblown antifuse, another resistive element, or a current source circuit.

In various embodiments, the amplifier 202 may have a read signal input terminal 211 to receive a READ signal and a delay element 210, coupled to the read signal input terminal 211, to generate a delayed version of the READ signal. In embodiments, the READ signal may be provided to the gates of transistors MP3 and MP4 as shown, and the delayed version of the READ signal may be provided to the gates of transistors MN3 and MN4, as shown. In various embodiments, the amplifier 202 may generate a first output signal at a first node 212 where the drain of transistor MP3 and the drain of transistor MN3 are electrically coupled, and the amplifier 202 may generate a second output signal at a second node 213 where the drain of transistor MP4 and the drain of transistor MN4 are electrically coupled. A first input terminal 220 of the comparator 204 may be coupled to the first node 212 to receive the first output signal from the amplifier 202 and a second input terminal 222 of the comparator 204 may be coupled to the second node 213 to receive the second output signal from the amplifier 202. In embodiments, the amplifier 202 may generate the first output signal based at least in part on a resistance of the programmable memory device 206. In embodiments, the amplifier 202 may generate the second output signal based at least in part on a current from the reference element 208. In embodiments, the reference element 208 may be a resistive element and the amplifier 202 may generate the second output signal based at least in part on a resistance of the reference element 208.

In various embodiments, the comparator 204 may be configured as a CMOS device having PMOS transistors MP5, MP6, MP7, MP8, MP9, and MP10, and NMOS transistors MN7, MN8, MN9, and MN10. The first output signal from the amplifier 202 may be coupled with the gates of transistors MP6, MP8, and MN8 and the second output signal from the amplifier 202 may be coupled with the gates of transistors MP5, MP7, and MN7 in various embodiments. In embodiments, the sources of the PMOS transistors MP5, MP6, MP7, MP8, MP9, and MP10 may be coupled with the voltage, $V_{DD}$. In embodiments, the drains of transistors MP6 and MP10 may be electrically coupled with the drain of transistor MN10 and the gates of transistors MP9 and MN9 at a first output node 214. The comparator 204 may generate a first voltage output, $V_{OUT1}$, at the first output node 214 in various embodiments. In embodiments, the drains of transistors MP5 and MP9 may be electrically coupled with the drain of transistor MN9 and the gates of transistors MP10 and MN10 at a second output node 215. The comparator 204 may generate a second voltage output, $V_{OUT2}$, at the second output node 215 in various embodiments. In embodiments, sources of transistors MN7 and MN8 may be electrically coupled with ground 209 which may be 0 volts, in various embodiments. In some embodiments, the comparator 204 may generate a different number of outputs.

In various embodiments, the transistor MP3 may be a first PMOS input transistor also referred to as $P_{FUSE}$ and the transistor MP4 may be a second PMOS input transistor also referred to as $P_{REF}$. The source of the first input transistor MP3 may be directly coupled with the programmable memory element 206 at a third node 216 and the second input transistor MP4 may be directly coupled with the reference element 208 at a fourth node 218, in various embodiments. The gates of the first and second input transistors MP3 and MP4 may be directly coupled with the READ signal input terminal 211 to directly receive a READ signal, in various embodiments.

During an idle mode, when the READ signal=$V_{DD}$, the first node 212 and the second node 213 may be tied to ground 209 and second stage output voltages, $V_{OUT1}$ and $V_{OUT2}$, may be pre-charged to $V_{DD}$ in various embodiments. After the READ signal switches from $V_{DD}$ to 0V, NMOS transistors MN3 and MN4 of the first stage may be switched off and currents flowing through MP3 ($P_{FUSE}$) and MP4 ($P_{REF}$) may charge the first node 212 and the second node 213, respectively, at different rates. In embodiments, those charging rates may be based at least in part on a resistive state of the programmable memory device 206. In embodiments, those charging rates may also be based at least in part on a current from the reference element 208. In embodiments, the reference element 208 may be a resistive element and the current from the reference element 208 may be based at least in part on a resistive value of the reference element 208. If the programmable memory device 206 has a resistive value higher than a resistive value of the reference element 208, the first node 212 may have a smaller slope than the second node 213, and if the reference element 208 has a resistive value higher than a resistive value of the programmable memory element 206, the second node 213 may have a smaller slope than the first node 212, in various embodiments. In embodiments, the second stage may transform the slope difference from the first node 212 and the second node 213 into a digital voltage level by first grounding $V_{OUT1}$ if the first node 212 has a higher slope than the second node 213, or by first grounding $V_{OUT2}$ if the second node 213 has a higher slope than the first node 212. In embodiments, the current consumption may switch off a very short period of time after the READ signal falling edge resulting in low power consumption and limited programmable memory device stress in the circuit 200.

In various embodiments, the gate voltage of transistors MP3 and MP4 may be strongly tied to 0 volts during the whole reading cycle, providing highly reduced kick back noise at the first node 212 and the second node 213. In embodiments, the first stage of the circuit 200 is using only one stack of transistors (MP3 and MP4) during the read operation (READ=0 Volts), transistors MN3 and MN4 are turned off and not participating in the first stage operation during read. In embodiments, this may allow the first stage to work down to the VDD voltage Vtp+$V_{RREF}$ where $V_{RREF}$ is the voltage drop across the reference element 208, which is a very small value at low voltage and Vtp is the PMOS threshold voltage. In embodiments, this may allow robust low voltage operation (e.g., above 4.5 sigma local variation at slow process corner, low temperature) and low power read. In embodiments, this may allow the circuit 200 to be more easily integrated into electronic devices and systems by allowing existing voltage supply rail configurations to be used. In embodiments, the circuit 200 may exhibit an accurate trip-point with a limited spread across different process corners.

In embodiments, robust low voltage operation may also reduce leakage and operating current consumption, resulting in a low level of power consumption by the circuit 200, which may be particularly beneficial for mobile devices or internet of things (IoT) devices that may include the circuit 200. In various embodiments, the circuit 200 may use a very short read operation which may reduce eFuse stress and improve chip lifetime by reducing fuse read disturb and a re-growing phenomenon. In some situations, when an eFuse is not well blown (e.g., resistance of a few kilo Ohms after blowing), it may allow a certain amount of current to flow through it, which induces stresses that can trigger a re-growing phenomenon (fuse resistance reduction). This re-growing may generate a fuse error where a blown fuse may be seen as an unblown one, which may reduce product lifetime. The short read operation of the circuit 200 may reduce this phenomenon in various embodiments.

In some embodiments, the first stage of the circuit 200 may include a “slew rate” like stage which charges a first output capacitor 224 and a second output capacitor 226 (with constant current) at different rates correlated with respective resistive input values (e.g., resistance values of the reference element and programmable memory device). In some embodiments, the first output capacitor 224 and the second output capacitor 226 may represent parasitic capacitors intrinsically bonded to transistors MP4 and MN4 with respect to the first output capacitor 224, and transistors MP3 and MN3 with respect to the second output capacitor 226. In various embodiments, the first output capacitor 224 or the second output capacitor 226 may be a capacitive element separate from the transistor MP4, MP3, MN4 or MN3. During the charge of the first output capacitor 224 and the second output capacitor 226, PMOS input transistors MP3 and MP4 may have their gates tied to a fixed voltage (e.g., 0 volts or a non-zero voltage) and may be operating in a saturation region which may greatly limit drain to source coupling, thereby limiting kick back noise and yielding a high level of trip-point accuracy. In some embodiments, the second stage of the circuit 200 may include a latch-like stage that transforms the slew rate difference into a digital voltage level.

Figure 3:
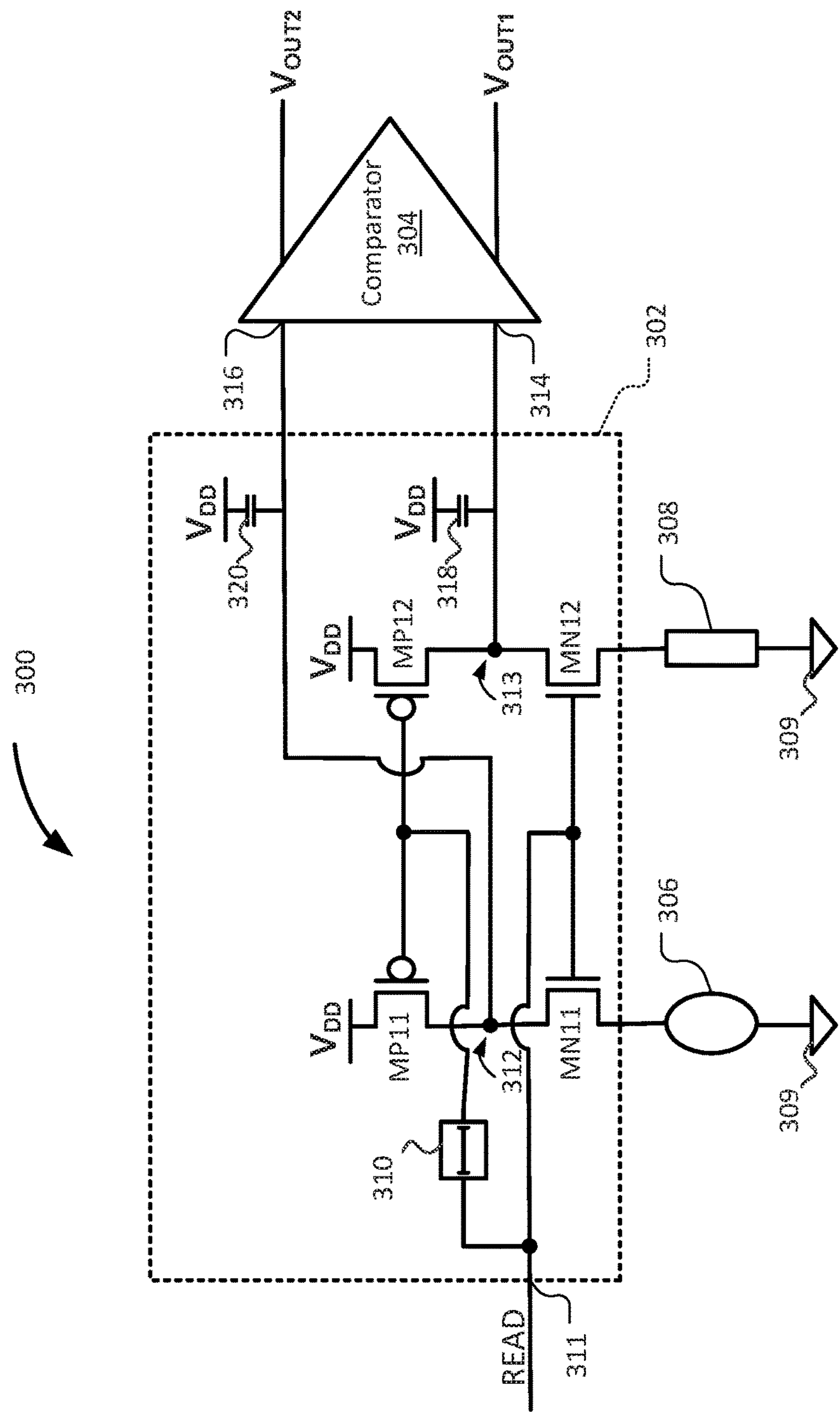
FIG. 3 illustrates a two stage dynamic sense amplifier circuit with N-type Metal Oxide Semiconductor (NMOS) input transistors, in accordance with various embodiments.

FIG. 3 illustrates a two stage dynamic sense amplifier circuit 300 (hereinafter “circuit 300”) with NMOS input transistors, in accordance with various embodiments. In embodiments, the circuit 300 may be a circuit for an electronic device that may include an amplifier 302 and a comparator 304. In embodiments, portions of the circuit 300 before the comparator 304 may be a first stage, and the comparator 304 may be a second stage. The comparator 304 may be configured as described with respect to the triggered latch comparator 204 in some embodiments.

The amplifier 302 may be configured as a CMOS device having PMOS transistors MP11 and MP12, and NMOS transistors MN11 and MN12. In some embodiments, a first terminal of a programmable memory device 306 and a first terminal of a reference element 308 may be electrically coupled with a reference voltage that, as shown, may be ground 309 at 0 volts. In some embodiments, a second terminal of the programmable memory device 306 may be electrically coupled with a source of transistor MN11 and a second terminal of the reference element 308 may be electrically coupled with a source of transistor MN12. In various embodiments, a drain of transistor MP11 may be electrically coupled with a drain of transistor MN11 and a drain of transistor MP12 may be electrically coupled with a drain of transistor MN12. A source of transistor MP11 and a source of transistor MP12 may be electrically coupled with a voltage $V_{DD}$.

In various embodiments, the programmable memory device 306 may be a device having a first resistance in a first state (first resistive state) and a second resistance in a second state (second resistive state), such as an eFuse, an antifuse, or a resistive memory core-cell (e.g., a phase change memory (PCM) device, an oxide random access memory (OXRAM) device, or a resistive memory device based on another technology). In embodiments, the first state may be an unblown state and the second state may be a blown state. In some embodiments where the programmable memory device 306 is an eFuse, the reference element 308 may be a resistive element that may have a resistance value less than or equal to the lowest expected resistance value of the eFuse in a blown state and greater than or equal to the highest expected resistance value of the eFuse in an unblown state. In some embodiments where the programmable memory device 306 is an antifuse, the reference element 308 may be a resistive element that may have a resistance value less than or equal to the lowest expected resistance value of the antifuse in an unblown state and greater than or equal to the highest expected resistance value of the antifuse in a blown state. In various embodiments, the reference element 308 may be a resistor, a trimmable resistor, an unblown eFuse, an unblown antifuse, another resistive element, or a current source circuit.

In various embodiments, the amplifier 302 may have a read signal input terminal 311 to receive a READ signal and a delay element 310 to generate a delayed version of the READ signal. In embodiments, the READ signal may be provided to the gates of transistors MN11 and MN12 as shown, and the delayed version of the READ signal may be provided to the gates of transistors MP11 and MP12, as shown. In various embodiments, the amplifier 302 may generate a first output signal at a first node 312 where the drain of transistor MP11 and the drain of transistor MN11 are electrically coupled, and the amplifier 302 may generate a second output signal at a second node 313 where the drain of transistor MP12 and the drain of transistor MN12 are electrically coupled. The comparator 304 may receive the first output signal from the amplifier 302 at a first input terminal 314 and the comparator 304 may receive the second output signal from the amplifier 302 at a second input terminal 316 in various embodiments. The comparator 304 may generate a first voltage output, $V_{OUT1}$ and a second voltage output, $V_{OUT2}$, based at least in part on the first and second output signals from the amplifier 302 in various embodiments. In some embodiments, the comparator 304 may generate a different number of outputs. In embodiments, the amplifier 302 may generate the first output signal based at least in part on a resistance of the programmable memory device 306. In embodiments, the amplifier 302 may generate the second output signal based at least in part on a current from the reference element 308. In embodiments, the reference element 308 may be a resistive element and the amplifier 302 may generate the second output signal based at least in part on a resistance of the reference element 308.

In some embodiments, the first stage of the circuit 300 may include a "slew rate" like stage which charges a first output capacitor 318 and a second output capacitor 320 (with constant current) at different rates correlated with respective resistive input values (e.g., resistance values of the reference element and programmable memory device). In some embodiments, the first output capacitor 318 and the second output capacitor 320 may represent parasitic capacitors intrinsically bonded to transistors MN12 and MP12 with respect to the first output capacitor 318, and MN11 and MP11 with respect to the second output capacitor 320. In various embodiments, the first output capacitor 318 or the second output capacitor 320 may be a capacitive element separate from the transistor MN12, MN11, MP12 or MP11. In some embodiments, the second stage of the circuit 300 may include a latch-like stage that transforms the slew rate difference into a digital voltage level.

Figure 4:
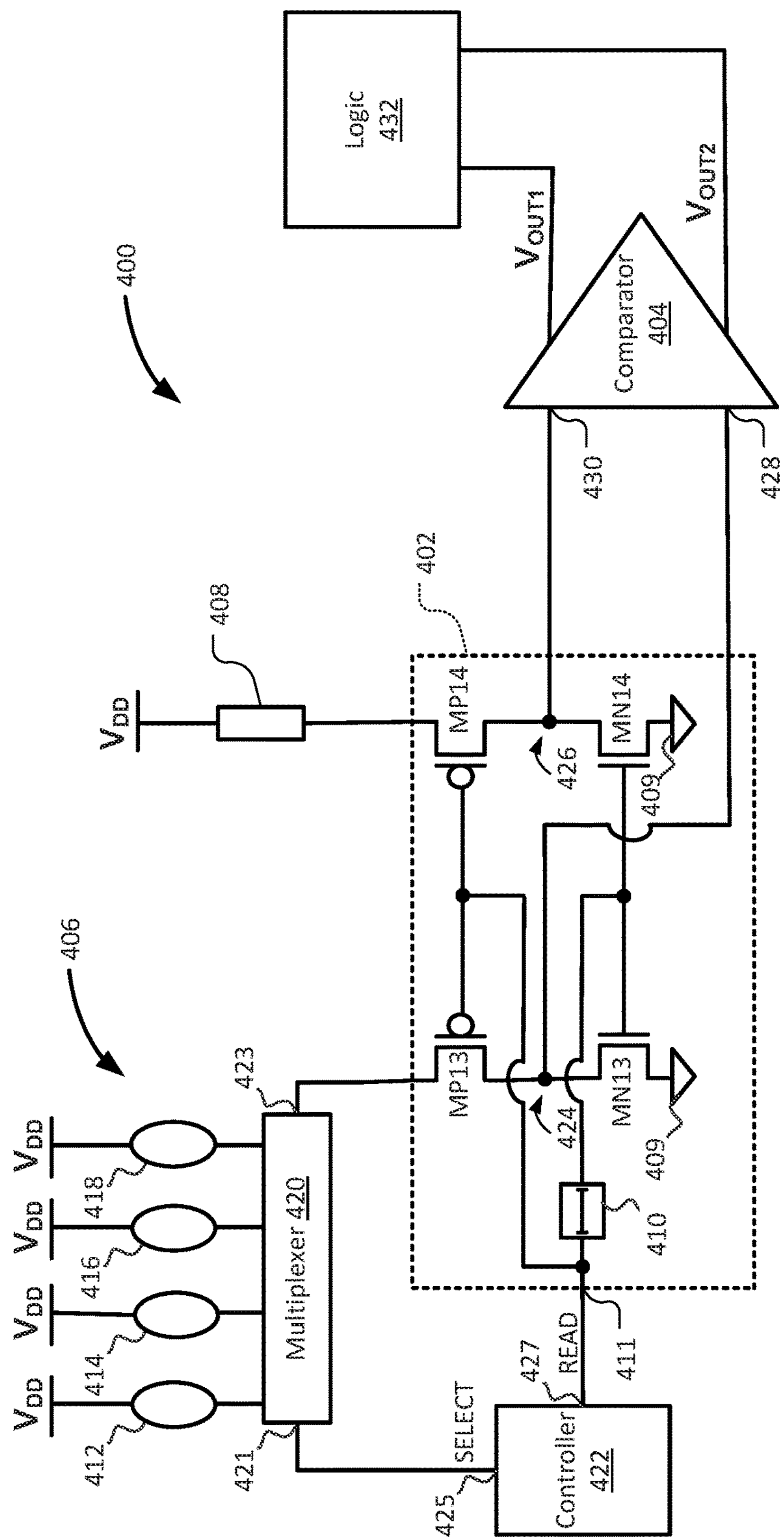
FIG. 4 illustrates an electronic device that includes a two stage dynamic sense amplifier circuit, in accordance with various embodiments.

FIG. 4 illustrates an electronic device 400 that includes a two stage dynamic sense amplifier circuit, in accordance with various embodiments. In embodiments, the two stage dynamic amplifier circuit of the electronic device 400 may include an amplifier 402 and a comparator 404. As shown, the amplifier 402 may include PMOS input transistors, but the amplifier 402 may include NMOS input transistors in some embodiments, in similar fashion to that described with respect to the amplifier 302 of FIG. 3. In various embodiments, the comparator 404 may be configured as a triggered latch comparator in similar fashion to that described with respect to the comparator 204 in FIG. 2.

The amplifier 402 may be configured as a CMOS device having PMOS transistors MP13 and MP14, and NMOS transistors MN13 and MN14. As shown, a plurality of programmable memory devices 406 may be coupled with the amplifier 402. A first terminal of a reference element 408 may receive a reference voltage $V_{DD}$ in various embodiments. In some embodiments, a second terminal of the reference element 408 may be electrically coupled with a source of transistor MP14. As shown, the plurality of programmable memory devices 406 may include a first programmable memory device 412, a second programmable memory device 414, a third programmable memory device 416, and a fourth programmable memory device 418 in various embodiments. However, the plurality of programmable memory devices 406 may include a different number of programmable memory devices in some embodiments. A first terminal of each programmable memory device in the plurality of programmable memory devices 406 may receive the reference voltage $V_{DD}$. A second terminal of each programmable memory device 412, 414, 416, and 418 in the plurality of programmable memory devices 406 may be coupled with a multiplexer 420 at a first input terminal, a second input terminal, a third input terminal, or a fourth input terminal of the multiplexer 420, respectively. In some embodiments, the electronic device 400 may be configured with a second multiplexer to selectively couple a plurality of reference elements 408 to the amplifier 402.

In embodiments, the multiplexer 420 may include a selection input terminal 421 to receive a SELECT signal such that the second terminal of each programmable memory device in the plurality of programmable memory devices 406 may be selectively electrically coupled with the source of the transistor MP13 at an output terminal 423 of the multiplexer 420. In embodiments, a different number of programmable memory devices 406 may be used, such as an array with 128 bits. In some embodiments, multiple bits may be on a bit line coupled with the multiplexer 420. In embodiments, a controller 422 may generate the SELECT signal at a first controller output terminal 425 coupled with the multiplexer 420. In various embodiments, a drain of transistor MP13 may be electrically coupled with a drain of transistor MN13 and a drain of transistor MP14 may be electrically coupled with a drain of transistor MN14. A source of transistor MN13 and a source of transistor MN14 may be electrically coupled with ground 409, which may be 0 volts, in various embodiments.

In some embodiments, each programmable memory device in the plurality of programmable memory devices 406 may be a device having a first resistance in a first state and a second resistance in a second state, such as an eFuse, an antifuse, or a resistive memory core-cell (e.g., a phase change memory (PCM) device, an oxide random access memory (OXRAM) device, or a resistive memory device based on another technology). In embodiments, the first state may be an unblown state and the second state may be a blown state. In some embodiments where each programmable memory device is an eFuse, the reference element 408 may be a resistive element that may have a resistance value less than or equal to the lowest expected resistance value of the eFuse in a blown state and greater than or equal to the highest expected resistance value of the eFuse in an unblown state. In some embodiments where each programmable memory device in the plurality of programmable memory devices 406 is an antifuse, the reference element 408 may be a resistive element that may have a resistance value less than or equal to the lowest expected resistance value of the antifuse in an unblown state and greater than or equal to the highest expected resistance value of the antifuse in a blown state. In various embodiments, the reference element 408 may be a resistor, a trimmable resistor, an unblown eFuse, an unblown antifuse, another resistive element, or a current source circuit.

In various embodiments, the amplifier 402 may have a read signal input terminal 411 to receive a READ signal and a delay element 410 to generate a delayed version of the READ signal. In some embodiments, the controller 422 may generate the READ signal at a second controller output terminal 427 coupled with the amplifier 402. In embodiments, the READ signal may be provided to the gates of transistors MP13 and MP14 as shown, and the delayed version of the READ signal may be provided to the gates of transistors MN13 and MN14, as shown. In various embodiments, the amplifier 402 may generate a first output signal at a first node 424 where the drain of transistor MP13 and the drain of transistor MN13 are electrically coupled, and the amplifier 402 may generate a second output signal at a second node 426 where the drain of transistor MP14 and the drain of transistor MN14 are electrically coupled. The comparator 404 may receive the first output signal from the amplifier 402 at a first input terminal 428 and the comparator 404 may receive the second output signal from the amplifier 402 at a second input terminal 430 in various embodiments. The comparator 404 may generate a first voltage output, $V_{OUT1}$ and a second voltage output, $V_{OUT2}$, based at least in part on the first and second output signals from the amplifier 402 in various embodiments. In some embodiments, the comparator 404 may generate a different number of outputs. A logic module 432 may receive output such as $V_{OUT1}$ and $V_{OUT2}$ from the comparator 404 in some embodiments. The logic module 432 may perform additional processing or actions based at least in part on one or more outputs from the comparator 404. In embodiments, the amplifier 402 may generate the first output signal based at least in part on a resistance of the currently selected programmable memory device 412, 414, 416, or 418 in the plurality of programmable memory devices 406. In embodiments, the amplifier 402 may generate the second output signal based at least in part on a current from the reference element 408. In embodiments, the reference element 408 may be a resistive element and the amplifier 402 may generate the second output signal based at least in part on a resistance of the reference element 408.

Figure 5:
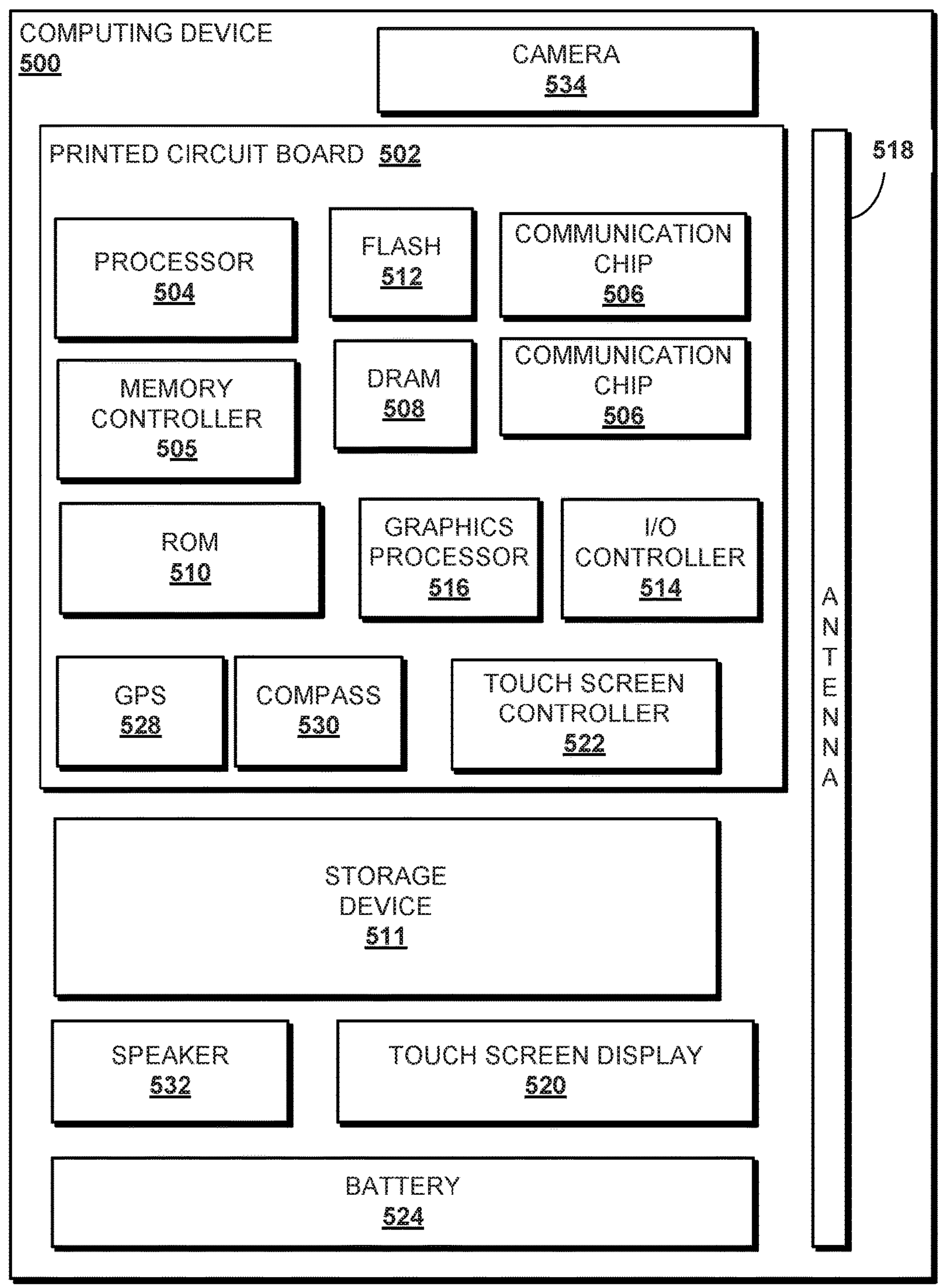
FIG. 5 illustrates an example computing device configured to employ the devices and circuits described herein, in accordance with various embodiments.

FIG. 5 illustrates an example computing device 500 that may employ the devices or circuits and/or portions thereof described herein (e.g., circuits 100, 200, or 300; or electronic device 400), in accordance with various embodiments. As shown, computing device 500 may include a number of components, such as one or more processor(s) 504 (one shown) and at least one communication chip 506. In various embodiments, the one or more processor(s) 504 each may include one or more processor cores. In various embodiments, the at least one communication chip 506 may be physically and electrically coupled to the one or more processor(s) 504. In further implementations, the communication chip 506 may be part of the one or more processor(s) 504. In various embodiments, computing device 500 may include printed circuit board (PCB) 502. For these embodiments, the one or more processor(s) 504 and communication chip 506 may be disposed thereon. In alternate embodiments, the various components may be coupled without the employment of PCB 502.

Depending on its applications, computing device 500 may include other components that may or may not be physically and electrically coupled to the PCB 502. These other components may include, but are not limited to, memory controller 505, volatile memory (e.g., dynamic random access memory (DRAM) 508), non-volatile memory such as read only memory (ROM) 510, flash memory 512, storage device 511 (e.g., a hard-disk drive (HDD)), an I/O controller 514, a digital signal processor (not shown), a crypto processor (not shown), a graphics processor 516, one or more antenna 518, a display (not shown), a touch screen display 520, a touch screen controller 522, a battery 524, an audio codec (not shown), a video codec (not shown), a global positioning system (GPS) device 528, a compass 530, an accelerometer (not shown), a gyroscope (not shown), a speaker 532, a camera 534, and a mass storage device (such as hard disk drive, a solid state drive, compact disk (CD), digital versatile disk (DVD)) (not shown), a power management unit (PMU) (not shown), and so forth. In various embodiments, the processor 504 may be integrated on the same die with other components to form a System on Chip (SoC). In embodiments, devices, circuits, and/or portions thereof described herein (e.g., circuits 100, 200, or 300; or electronic device 400) may be implemented in any digital and/or analog circuits of the computing device 500 that use programmable resistive memory.

In some embodiments, the one or more processor(s) 504, flash memory 512, and/or storage device 511 may include associated firmware (not shown) storing programming instructions configured to enable computing device 500, in response to execution of the programming instructions by one or more processor(s) 504, to practice all or selected aspects of the methods described herein. In various embodiments, these aspects may additionally or alternatively be implemented using hardware separate from the one or more processor(s) 504, flash memory 512, or storage device 511.

In various embodiments, one or more components of the computing device 500 may include the circuit 100, 200, and/or 300; and/or the electronic device 400 described herein. For example, the circuit 100, 200, and/or 300; and/or the electronic device 400 may be included in I/O controller 514, processor 504, memory controller 505, and/or another component of computing device 500. In some embodiments, the circuit 100, 200, and/or 300; and/or the electronic device 4000 may be included in the processor 504. In embodiments, the processor 504 or another component of the computing device 500 may include a plurality of circuits 100, 200, and/or 300; and/or electronic devices 400.

The communication chips 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi, near field communication (NFC), and Bluetooth, and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 500 may be any other electronic device that processes digital or analog data or signals. In some embodiments, the computing device 500 may be a system that may employ the devices or circuits and/or portions thereof described herein (e.g., circuits 100, 200, or 300; or electronic device 400), in accordance with various embodiments.

Some non-limiting Examples are presented below.

Example 1 may include an electronic circuit comprising: a programmable memory device having a first resistance in a first state and a second resistance in a second state, the programmable memory device having a first terminal to receive a first reference voltage and a second terminal, wherein the programmable memory device is an eFuse, an antifuse, or a resistive memory core-cell; a reference element having a first terminal to receive a second reference voltage and a second terminal, wherein the reference element is a resistive element or a current source circuit; an amplifier having a read signal input terminal to receive a read signal, the amplifier coupled with the second terminal of the programmable memory device and the second terminal of the reference element, wherein the amplifier is to generate, based at least in part on the read signal, a first output signal based at least in part on the resistance of the programmable memory device and a second output signal based at least in part on a current from the reference element; and a comparator coupled with the amplifier, the comparator to receive the first and second output signals from the amplifier and to determine a state of the programmable memory device based on the first and second output signals.

Example 2 may include the subject matter of Example 1, wherein: the amplifier includes a first transistor and a second transistor; the second terminal of the programmable memory device is coupled with a source of the first transistor; the second terminal of the reference element is coupled with a source of the second transistor; a gate of the first transistor is to receive the read signal; and a gate of the second transistor is to receive the read signal.

Example 3 may include the subject matter of any one of Examples 1-2, wherein the programmable memory device is an eFuse; the first state is an unblown state of the eFuse; and the second state is a blown state of the eFuse.

Example 4 may include the subject matter of any one of Examples 1-2, wherein the programmable memory device is an antifuse.

Example 5 may include the subject matter of any one of Examples 1-4, wherein the comparator is a latch comparator.

Example 6 may include the subject matter of any one of Examples 1-5, wherein the comparator includes a first output terminal and a second output terminal.

Example 7 may include the subject matter of any one of Examples 1-6, wherein the reference element is a trimmable resistive element having a trimming signal input terminal.

Example 8 may include the subject matter of any one of Examples 2-3, wherein: the programmable memory device is an eFuse; the amplifier includes a third transistor and a fourth transistor; a drain of the first transistor is coupled with a drain of the third transistor; a drain of the second transistor is coupled with a drain of the fourth transistor; a gate of the third transistor is to receive a delayed version of the read signal; and a gate of the fourth transistor is to receive the delayed version of the read signal.

Example 9 may include the subject matter of any one of Examples 1-8, wherein the reference element is a resistive element having a resistance between the first resistance and the second resistance.

Example 10 may include the subject matter of any one of Examples 2-9, wherein the first transistor is a P-type metal oxide semiconductor (PMOS) transistor and the second transistor is a PMOS transistor.

Example 11 may include the subject matter of any one of Examples 2-9, wherein the first transistor is an N-type metal oxide semiconductor (NMOS) transistor and the second transistor is an NMOS transistor.

Example 12 may include the subject matter of any one of Examples 2-11, further comprising a multiplexer having a first input terminal, a second input terminal, a selection input terminal, and an output terminal, wherein the programmable memory device is a first programmable memory device, wherein the electronic circuit further comprises a second programmable memory device having a first resistance in a first state and a second resistance in a second state, the second programmable memory device having a first terminal to receive a reference voltage and a second terminal, wherein the second terminal of the first programmable memory device is coupled with the first input terminal of the multiplexer, wherein the second terminal of the second programmable memory device is coupled with the second input terminal of the multiplexer, and wherein the output terminal of the multiplexer is coupled with the source of the first transistor such that the source of the first transistor is selectively coupled with the second terminal of the first programmable memory device or the second terminal of the second memory device in response to a selection signal received at the selection input terminal of the multiplexer.

Example 13 may include an electronic device comprising: a controller to generate a read signal; a programmable memory device having a first resistance in a first state and a second resistance in a second state, the programmable memory device having a first terminal to receive a first reference voltage and a second terminal, wherein the programmable memory device is an eFuse, an antifuse, or a resistive memory core-cell; a reference element having a first terminal to receive a second reference voltage and a second terminal, wherein the reference element is a resistive element or a current source circuit; an amplifier having a read signal input terminal to receive a read signal, the amplifier coupled with the second terminal of the programmable memory device and the second terminal of the reference element wherein the amplifier is to generate, based at least in part on the read signal, a first output signal based at least in part on the resistance of the programmable memory device and a second output signal based at least in part on a current from the reference element; a comparator coupled with the amplifier, the comparator having a first input terminal to receive the first output signal from the amplifier, a second input terminal to receive the second output signal from the amplifier, and an output terminal; and logic coupled with the output terminal of the comparator, wherein the amplifier is to receive the read signal, wherein the comparator is to output a voltage based at least in part on the first and second output signals from the amplifier, and wherein the logic is to receive the voltage output from the comparator.

Example 14 may include the subject matter of Example 13, wherein: the amplifier includes a first transistor and a second transistor; the second terminal of the programmable memory device is coupled with a source of the first transistor; the second terminal of the reference element is coupled with a source of the second transistor; a gate of the first transistor is to receive the read signal; and a gate of the second transistor is to receive the read signal.

Example 15 may include the subject matter of any one of Examples 13-14, wherein the comparator is a triggered latch comparator having a first output terminal and a second output terminal.

Example 16 may include the subject matter of any one of Examples 14-15, wherein: the programmable memory device is an eFuse; the first state is an unblown state of the eFuse; the second state is a blown state of the eFuse; the amplifier includes a third transistor and a fourth transistor; a drain of the first transistor is coupled with a drain of the third transistor; a drain of the second transistor is coupled with a drain of the fourth transistor; a gate of the third transistor is to receive a delayed read signal; and a gate of the fourth transistor is to receive the delayed read signal.

Example 17 may include the subject matter of any one of Examples 14-16, wherein the reference element is a resistive element having a resistance between the first resistance and the second resistance.

Example 18 may include the subject matter of any one of Examples 14-17, further comprising a multiplexer having a first input terminal, a second input terminal, a selection input terminal, and an output terminal, wherein the programmable memory device is a first programmable memory device, wherein the electronic circuit further comprises a second programmable memory device having a first resistance in a first state and a second resistance in a second state, the second programmable memory device having a first terminal to receive a reference voltage and a second terminal, wherein the second terminal of the first programmable memory device is coupled with the first input terminal of the multiplexer, wherein the second terminal of the second programmable memory device is coupled with the second input terminal of the multiplexer, wherein the controller is to generate a selection signal, and wherein the output terminal of the multiplexer is coupled with the source of the first transistor such that the source of the first transistor is selectively coupled with the second terminal of the first programmable memory device or the second terminal of the second memory device in response to the selection signal received at the selection input terminal of the multiplexer.

Example 19 may include the subject matter of any one of Examples 14-18, further comprising a processor, a memory coupled with the processor, and a display coupled with the processor, wherein the processor includes the programmable memory device, the reference element, the amplifier, and the comparator.

Example 20 may include a system comprising: a processor; and an electronic circuit having: a programmable memory device having a first resistance in a first state and a second resistance in a second state, the programmable memory device having a first terminal to receive a first reference voltage and a second terminal, wherein the programmable memory device is an eFuse, an antifuse, or a resistive memory core-cell; a reference element having a first terminal to receive a second reference voltage and a second terminal, wherein the reference element is a resistive element or a current source circuit; an amplifier having a read signal input terminal to receive a read signal, the amplifier coupled with the second terminal of the programmable memory device and the second terminal of the reference element, wherein the amplifier is to generate, based at least in part on the read signal, a first output signal based at least in part on the resistance of the programmable memory device and a second output signal based at least in part on a current from the reference element; and a comparator coupled with the amplifier, the comparator to receive the first and second output signals from the amplifier and to determine a state of the programmable memory device based on the first and second output signals, wherein the electronic circuit is included in the processor.

Example 21 may include the subject matter of Example 20, wherein: the amplifier includes a first transistor and a second transistor; the second terminal of the programmable memory device is coupled with a source of the first transistor; the second terminal of the reference element is coupled with a source of the second transistor; a gate of the first transistor is to receive the read signal; and a gate of the second transistor is to receive the read signal.

Example 22 may include the subject matter of any one of Examples 20-21, further comprising a display coupled with the processor.

Example 23 may include the subject matter of any one of Examples 20-22, wherein the programmable memory device is an eFuse.

Example 24 may include the subject matter of any one of Examples 21-22, wherein the programmable memory device is an antifuse.

Example 25 may include the subject matter of any one of Examples 20-24, wherein the comparator is a latch comparator.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. An electronic circuit comprising:

a programmable memory device having a first resistance in a first state and a second resistance in a second state, the programmable memory device having a first terminal to receive a reference voltage and a second terminal, wherein the programmable memory device is an eFuse, an antifuse, or a resistive memory core-cell;

a reference element having a first terminal to receive the reference voltage and a second terminal, wherein the reference element is a trimmable resistive element having an input terminal to receive a trimming signal; and an amplifier having a read signal input terminal to receive a read signal, the amplifier coupled with the second terminal of the programmable memory device and the second terminal of the reference element, wherein the amplifier is to generate, based at least in part on the read signal, a first output signal based at least in part on the resistance of the programmable memory device and a second output signal based at least in part on a current from the reference element.

2. The electronic circuit of claim 1, further comprising a comparator coupled with the amplifier, the comparator to receive the first and second output signals from the amplifier and to generate one or more comparator output signals based at least in part on the first and second output signals from the amplifier.

3. The electronic circuit of claim 2, wherein the comparator is a latch comparator.

4. The electronic circuit of claim 1, wherein:

the programmable memory device is an eFuse;

the first state is an unblown state of the eFuse; and the second state is a blown state of the eFuse.

5. The electronic circuit of claim 1, wherein the programmable memory device is an antifuse.

6. The electronic circuit of claim 1, wherein the trimmable resistive element has a resistance between the first resistance and the second resistance.

7. The electronic circuit of claim 1, wherein:

the amplifier includes a first transistor and a second transistor;

the second terminal of the programmable memory device is coupled with a source of the first transistor;

the second terminal of the reference element is coupled with a source of the second transistor;

a gate of the first transistor is to receive the read signal; and a gate of the second transistor is to receive the read signal.

8. The electronic circuit of claim 7, wherein:

the programmable memory device is an eFuse;

the amplifier includes a third transistor and a fourth transistor;

a drain of the first transistor is coupled with a drain of the third transistor;

a drain of the second transistor is coupled with a drain of the fourth transistor;

a gate of the third transistor is to receive a delayed version of the read signal; and a gate of the fourth transistor is to receive the delayed version of the read signal.

9. The electronic circuit of claim 7, wherein the first transistor is a P-type metal oxide semiconductor (PMOS) transistor and the second transistor is a PMOS transistor.

10. The electronic circuit of claim 7, wherein the first transistor is an N-type metal oxide semiconductor (NMOS) transistor and the second transistor is an NMOS transistor.

11. The electronic circuit of claim 1, further comprising a multiplexer having a first input terminal, a second input terminal, a selection input terminal, and an output terminal, wherein the programmable memory device is a first programmable memory device, wherein the electronic circuit further comprises a second programmable memory device having a first resistance in a first state and a second resistance in a second state, the second programmable memory device having a first terminal to receive the reference voltage and a second terminal, wherein the second terminal of the first programmable memory device is coupled with the first input terminal of the multiplexer, wherein the second terminal of the second programmable memory device is coupled with the second input terminal of the multiplexer, and wherein the output terminal of the multiplexer is coupled with the amplifier such that the amplifier is selectively coupled with the second terminal of the first programmable memory device or the second terminal of the second programmable memory device in response to a selection signal received at the selection input terminal of the multiplexer.

12. An electronic device comprising:

a controller to generate a read signal;

a programmable memory device having a first resistance in a first state and a second resistance in a second state, the programmable memory device having a first terminal to receive a reference voltage and a second terminal;

a reference element having a first terminal to receive the reference voltage and a second terminal; and an amplifier having a read signal input terminal to receive a read signal, the amplifier coupled with the second terminal of the programmable memory device and the second terminal of the reference element wherein the amplifier is to generate, based at least in part on the read signal, a first output signal based at least in part on the resistance of the programmable memory device and a second output signal based at least in part on a current from the reference element;

a comparator coupled with the amplifier, the comparator having a first input terminal to receive the first output signal from the amplifier, a second input terminal to receive the second output signal from the amplifier, and an output terminal; and logic coupled with the output terminal of the comparator, wherein the amplifier is to receive the read signal, wherein the comparator is to output a voltage based at least in part on the first and second output signals from the amplifier, and wherein the logic is to receive the voltage output from the comparator.

13. The electronic device of claim 12, wherein:

the amplifier includes a first transistor and a second transistor;

the second terminal of the programmable memory device is coupled with a source of the first transistor;

the second terminal of the reference element is coupled with a source of the second transistor;

a gate of the first transistor is to receive the read signal; and a gate of the second transistor is to receive the read signal.

14. The electronic device of claim 12, wherein the comparator is a triggered latch comparator having a first output terminal and a second output terminal.

15. The electronic device of claim 12, further comprising a multiplexer having a first input terminal, a second input terminal, a selection input terminal, and an output terminal, wherein the programmable memory device is a first programmable memory device, wherein the electronic circuit further comprises a second programmable memory device having a first resistance in a first state and a second resistance in a second state, the second programmable memory device having a first terminal to receive the reference voltage and a second terminal, wherein the second terminal of the first programmable memory device is coupled with the first input terminal of the multiplexer, wherein the second terminal of the second programmable memory device is coupled with the second input terminal of the multiplexer, wherein the controller is to generate a selection signal, and wherein the output terminal of the multiplexer is coupled with the amplifier such that the amplifier is selectively coupled with the second terminal of the first programmable memory device or the second terminal of the second programmable memory device in response to the selection signal received at the selection input terminal of the multiplexer.

16. The electronic device of claim 12, further comprising a processor, a memory coupled with the processor, and a display coupled with the processor, wherein the processor includes the programmable memory device, the reference element, the amplifier, and the comparator.

17. A system comprising:

a display; and a processor coupled with the display, wherein the processor includes an electronic circuit that comprises:

a programmable memory device having a first resistance in a first state and a second resistance in a second state, the programmable memory device having a first terminal to receive a reference voltage and a second terminal, wherein the programmable memory device is an eFuse, an antifuse, or a resistive memory core-cell;

a reference element having a first terminal to receive the reference voltage and a second terminal; and an amplifier having a read signal input terminal to receive a read signal, the amplifier coupled with the second terminal of the programmable memory device and the second terminal of the reference element, wherein the amplifier is to generate, based at least in part on the read signal, a first output signal based at least in part on the resistance of the programmable memory device and a second output signal based at least in part on a current from the reference element, wherein:

the amplifier includes a first transistor;

the second terminal of the programmable memory device is coupled with a source of the first transistor; and a gate of the first transistor is to receive the read signal.

18. The system of claim 17, wherein:

the amplifier includes a second transistor;

the second terminal of the reference element is coupled with a source of the second transistor; and a gate of the second transistor is to receive the read signal.

19. The system of claim 17, wherein the programmable memory device is an eFuse.

20. The system of claim 17, wherein the programmable memory device is an antifuse.

21. The system of claim 17, further comprising a latch comparator coupled with the amplifier, the latch comparator to receive the first and second output signals form the amplifier and to generate one or more comparator output signals based at least in part on the first and second output signals from the amplifier.

* * * * *